United States Patent [19]
Webster

[11] Patent Number: 4,710,751
[45] Date of Patent: Dec. 1, 1987

[54] GROUND FAULT MONITOR CIRCUIT

[75] Inventor: James B. Webster, Santa Ana, Calif.

[73] Assignee: Environmental Protection Systems, Irvine, Calif.

[21] Appl. No.: 855,400

[22] Filed: Apr. 24, 1986

[51] Int. Cl.$^4$ ............................................. G08B 19/60
[52] U.S. Cl. .................................. 340/522; 340/532; 340/562; 340/649; 340/652; 340/679; 340/680; 340/573; 361/220; 361/42; 200/DIG. 2
[58] Field of Search .............. 340/522, 521, 524, 530, 340/532, 561, 562, 635, 649, 571-573, 650, 652, 665, 666, 679, 680, 686; 200/DIG. 1, DIG. 2; 361/212, 220, 42

[56] References Cited

U.S. PATENT DOCUMENTS 4,558,309 12/1985 Antoneuich ......................... 340/649
4,605,984 8/1986 Fiedler ................................ 361/220

OTHER PUBLICATIONS

"Electrical Overstress/Electrostatic Discharge Symposium Proceedings", *Reliability Analysis Center*, 1982, pp. 1–14.

Primary Examiner—Donnie L. Crosland
Attorney, Agent, or Firm—G. Donald Weber, Jr.

[57] ABSTRACT

A sensor circuit for detecting a ground fault in devices that eliminate or prevent static electricity and for producing appropriate alarm signals to indicate an undesirable ungrounded condition. In particular, the sensor circuit includes means for monitoring a ground-fault system by using a wrist strap monitoring circuit, a proximity monitoring circuit and at least one surface monitoring circuit. The wrist strap monitoring circuit and the surface monitoring circuits are used to detect the status of a grounding connection between an operator and/or a surface at a work station and a ground potential. The proximity monitoring circuit is used to determine whether an operator (or another person) is in proximity to the work station. A logic circuit means detects the status of the aforementioned monitoring circuits and selectively activates an alarm means if a fault condition exists.

29 Claims, 5 Drawing Figures

GROUND FAULT MONITOR CIRCUIT

BACKGROUND

1. Field of the Invention.

This invention is directed to detector circuits, in general, and, more particularly, to circuits which detect specific circuit conditions in relation to devices that prevent and eliminate electro-static charges, for example, by grounding or the like.

2. Prior Art.

There are many types of detector circuits known in the art. These detector circuits are frequently used in conjunction with manufacturing and assembly processes which are performed on or with electrically sensitive devices, such as semiconductor devices (e.g., chips or wafers), circuits including these semiconductor devices, and the like. It is well-known that if, during the manufacturing or assembly process, a technician (or the workstation) develops an undesirable level of static charge, the semiconductor device can be damaged when the potential is discharged. Likewise, if the device is brought close enough to a static voltage field so that a difference in potential can be induced in the device, the device can destroy itself from within. This damage can render the entire device (and its related circuitry) useless and worthless. This damage can be a very costly occurrence. Thus, with only a small "fault", the device becomes defective and all of the "added value" activity, processing, testing at all stages of sub-assembly and final assembly, and field testing is destroyed and the entire product becomes valueless. Additionally, the insidious nature of this type of damage may not be manifested until long after the device, subassembly, and system are in the field for some time, thus significantly increasing the cost of repair.

In the past, several techniques have been utilized to avoid the electro-static charge problem. For example, the conductive or dissipative work surface is "earth" grounded by strap connections or the like on the premise that the charge will be drained off before a problem occurs.

In other cases, flooring (such as a conductive floor mat or conductive tile) is provided at the workstation on the premise that electrical charge will be drained off before a problem occurs.

Additionally, other discharge devices are used in and around the workstation. These devices include electrically conductive straps worn by the worker. For example, straps are worn around a worker's shoes so that the worker becomes connected to grounded, conductive flooring (such as a conductive floor mat or conductive tile). Also, wrist straps of conductive material are used to connect the worker to ground through a suitable resistance (i.e., one megohm). Likewise, conductive materials, bins, cups and shelves are grounded.

All of these techniques are occasionally used in conjunction with each other in extreme cases.

To ensure grounding integrity, circuits have been used to detect continuity at the workstation. In some cases, circuits have been used to detect that the wrist strap is being worn by an operator. In this way, the work is, effectively, connected to ground through an alarm circuit. If the ground connection is broken, an alarm sounds to warn of a fault condition.

While all of the prior art circuits and systems have a certain amount of usefulness, they generally do not fulfill all of the expected safeguards in a completely satisfactory manner. Therefore, additional monitoring techniques and systems are still being sought and developed.

SUMMARY OF THE INSTANT INVENTION

This invention is directed to a monitoring system which is used, specifically, to continuously monitor the devices which prevent and/or eliminate static charge build-up to determine whether dangerous conditions exist or have been avoided by appropriate grounding techniques.

The system includes a wrist strap (to be worn by an operator) and a wrist strap monitor which can be a capacitive measurement circuit, as well as a work surface monitoring circuit with one or more accessory monitoring circuits which can be considered to be resistance measurement circuits, e.g., continuity detectors.

In addition, the system includes a proximity detector circuit which determines that an ungrounded individual has approached the work surface while the monitoring system is in operation.

Appropriate signaling devices are utilized. For example, light indicators can be used to indicate a fault at a respective work level or accessory. Likewise, light indicators can be used to indicate the operational status of the wrist strap monitor or the like.

Similarly, sound producing devices such as beepers or buzzers can be used to indicate other status conditions related to the proximity sensor or the like.

The system can include appropriate power supply means as well as multivibrator (or oscillator) means to drive the respective indicators so that appropriate tone and/or flashing lights can be achieved.

DESCRIPTION OF PREFERRED EMBODIMENTS

Figure 1:
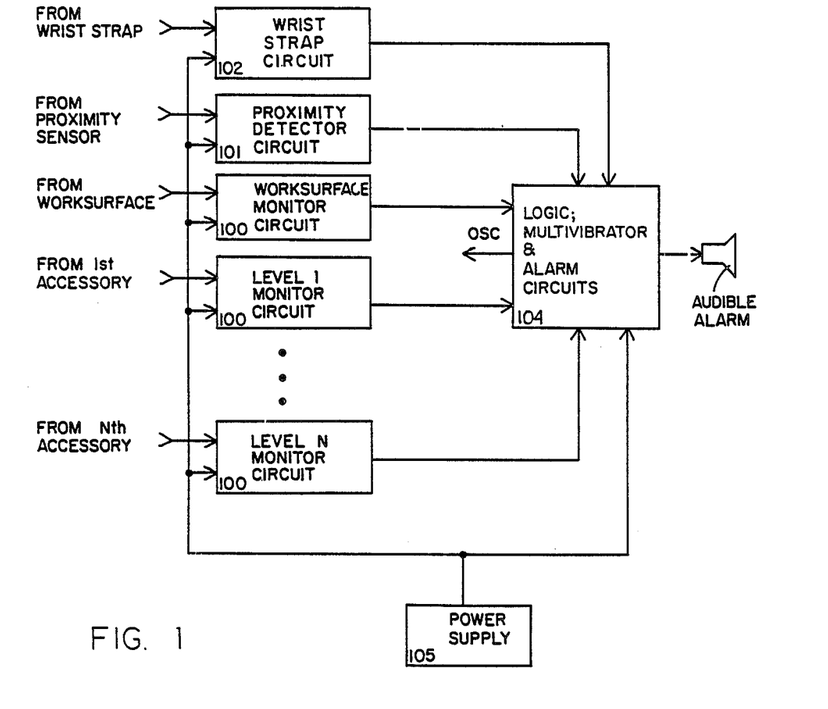
FIG. 1 is a block diagram of the system of the instant invention.

Referring now to FIG. 1, there is shown a block diagram of the instant invention. This block diagram is utilized to show the overall relationship of the respective portions of the system. Of course, it must be understood that the specific interconnections between the several parts of the system are not shown in detail.

In particular, monitor circuits 100 represent the circuits which are used to sense the resistance value at the respective locations at a workstation of the type involved. The monitors are, in this embodiment, all of substantially the same configuration. The locations to be monitored can include shelf levels, work surfaces, parts bins, parts cups and so forth.

The wrist strap circuit 102 is used in conjunction with the operator at the workstation, per se. The wrist strap circuit is arranged to determine if the operator has been properly grounded or the like, so as to discharge the person and prevent electro-static build-up which, if discharged through the product, could be deleterious and undesirable, as noted above.

The proximity detector circuit 101 is used to detect the presence of a person adjacent to, in close proximity to or sitting at the workstation. When the presence (i.e., proximity) of this person is detected, and the person has not properly affixed the wrist strap, thereby becoming discharged to ground, the alarm is sounded until such time as the person at the workstation has been properly hooked up to the discharge system.

Logic, multivibrator and alarm circuits 104 are used in conjunction with the system. The alarm circuits drive alarm devices which can take the form of buzzers and/or beepers which are activated by the wrist strap circuit and/or by any of the resistance monitor circuits with an excessively high resistance measurement between ground and the input to the work surface monitor circuit, by any of the accessory monitor circuit inputs and/or by the wrist strap circuit. In this case, the offending fault will be indicated by an audible tone so as to attract the attention of the workstation operator, supervisor, or other management personnel without the necessity for studying the various other light indicators or the like. The audible tone is an additional safeguard feature.

The multivibrator portion of circuit 104 provides the oscillator signal OSC. In the instant embodiment, oscillator signal OSC is, typically, a free-running, square wave pulse which has a 300 millisecond pulse and a 50% duty cycle. This signal is supplied through suitable circuitry to the resistance monitors 100 and the wrist strap monitors 102. The power supply 105 is a suitable power supply which provides the desired voltage and current signals to the remainder of the circuit. Typically, the power supply 105 is operative to convert an input signal, such as 110 VAC or the like, to a 10-12 volt regulated DC signal or any other appropriate signal which may be desired. A regulator is then used to regulate the DC signal to a level of 8 VDC for use by the remainder of the circuit. In the instant embodiment, regulated signals of 8 and 4.0 volts DC are utilized. However, it is well within the skill of the art to develop other or additional voltage requirements.

Figure 2:
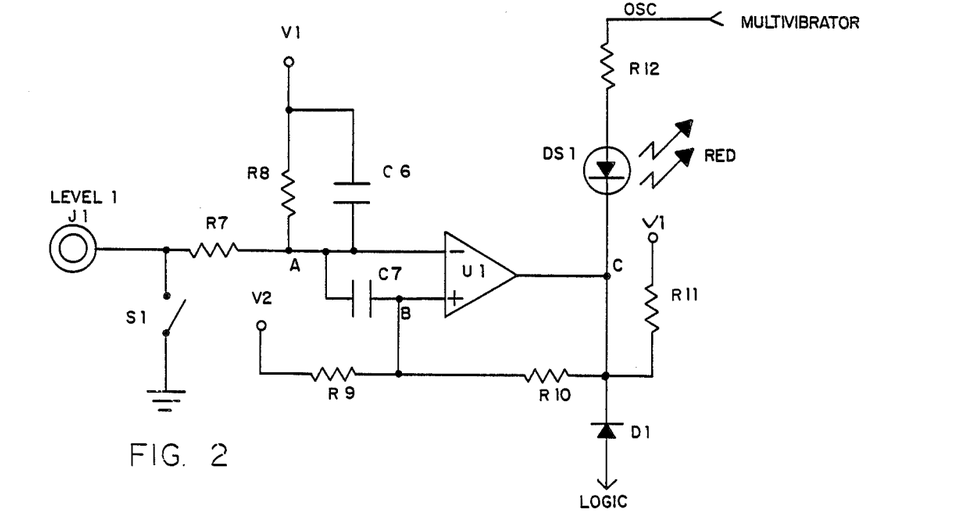
FIG. 2 is a schematic diagram of the resistance monitor portion of the system of the instant invention.

Referring now to FIG. 2, there is shown a schematic diagram of a resistance monitor circuit of the type indicated by work surface and level monitor circuits 100 in FIG. 1. In FIG. 1, N monitor circuits are suggested. However, only a single monitor, i.e., Level 1, circuit is described in detail. It is understood that the other monitor circuits are substantially similar.

The circuit includes a suitable connector symbolized by jack J1. This connector or jack is adapted to be connected to the appropriate work surface or accessory at the workstation. Any conventional type of jack or clip can be utilized.

Jack J1 is connected to optional switch S1 which is connected to ground. Thus, switch S1 can be used to selectively bypass the circuit, if so desired. Typically, no switch would be used with the work surface monitor circuit but only on the accessory monitor circuits. This permits the modular design of the system to be utilized with greater flexibility. That is, a plurality of switches (typically in the form of DIP switches) can be built into the system. Thus, the number of accessory levels which are to be monitored can be readily and easily controlled.

Assuming that switch S1 is open and the system is not bypassed, a voltage divider network is formed by resistors R7, R8 and the resistance between jack J1 and ground. Resistors R7 and R8 are connected between voltage source V1 and jack J1. Thus, the magnitude of the resistance in the divider between jack J1 and ground will affect the voltage level at node A. This voltage is applied to the minus (−) terminal of comparator U1. In a similar fashion, a reference potential V2 is supplied to node B at the plus (+) terminal of comparator U1 by means of bias resistor R9.

If the voltage at node A is lower than the reference voltage V2 (which is approximately one-half the voltage V1), comparator U1 produces a high output signal. This high output signal is applied to the cathode of a light producing element DS1 which can be a typical light emitting diode (LED). With a high level signal applied at the cathode of LED DS1, the diode is reverse biased and, effectively, turned off. The voltage at node A is low when switch S1 is closed (to bypass this circuit) or when the level connected to jack J1 has a low resistance to ground.

Conversely, if switch S1 is open and jack J1 is not grounded (i.e., the grounding connection for the monitored level is broken or the level has a high potential for some reason), the voltage at node A is pulled high by source V1 via resistor R8. As a consequence, comparator U1 produces a low level output signal which is supplied to the cathode of diode of DS1. With this low level signal at the cathode, diode DS1 is rendered conductive and becomes lighted.

That is, as will be seen subsequently, the signal OSC from the multivibrator circuit is continuously supplied to the anode of diode of DS1 via resistor R12. This oscillating signal, which is preferrably in the nature of a square or rectangular pulse, causes diode DS1 to be selectively activated and illuminated when the signal OSC is high and the output of comparator U1 is low. Therefore, a flashing or pulsating light is produced which is, of course, more readily detected.

The capacitors C6 and C7 are used to filter out any interference signals such as 60 Hz hum, atmospheric radio signals and the like.

Positive feedback resistor R10 is connected "around" comparator U1 and provides a certain amount of hysteresis for the comparator. Thus, the level circuit is maintained clearly in the "on" condition or the "off" condition, (not in the linear region). Therefore, diode DS1 does not illuminate dimly or flicker but remains either "on" or "off" (in accordance with the control signals supplied thereto).

Resistor R7 is placed between the node A and jack J1 to provide protection for the comparator U1 in the presence of high potentials at jack J1. Resistor R8 determines the "trip" point for the circuit, i.e., the value for which any further increase in resistance between jack J1 and ground will cause a fault indication.

That is, unless and until the low level signal is supplied to the cathode of the LED, the OSC signal is ineffective to render the LED operative. Thus, the activation of diode DS1 is used to indicate a "fault" condition when the resistance between J1 and ground exceeds the value of R8. In this embodiment, DS1 is selected to be a red LED, although other colors can be utilized.

Optional switch S1, as shown in this circuit, permits selective disabling of the circuit. It is possible that in some instances, a disabling switch may not be desirable. Consequently, the switch can be omitted in that instance.

It should be noted that the output terminal of comparator U1 is also connected to the cathode of a rectifier diode D1. The anode of diode D1 is connected to logic circuit 104 as described hereinafter. In the preferred embodiment, diode D1 forms a portion of an OR-gate in logic circuit 104. Thus, if any one of the diodes in the fault LED's is illuminated, one of the logic OR-gate is activated.

Figure 3:
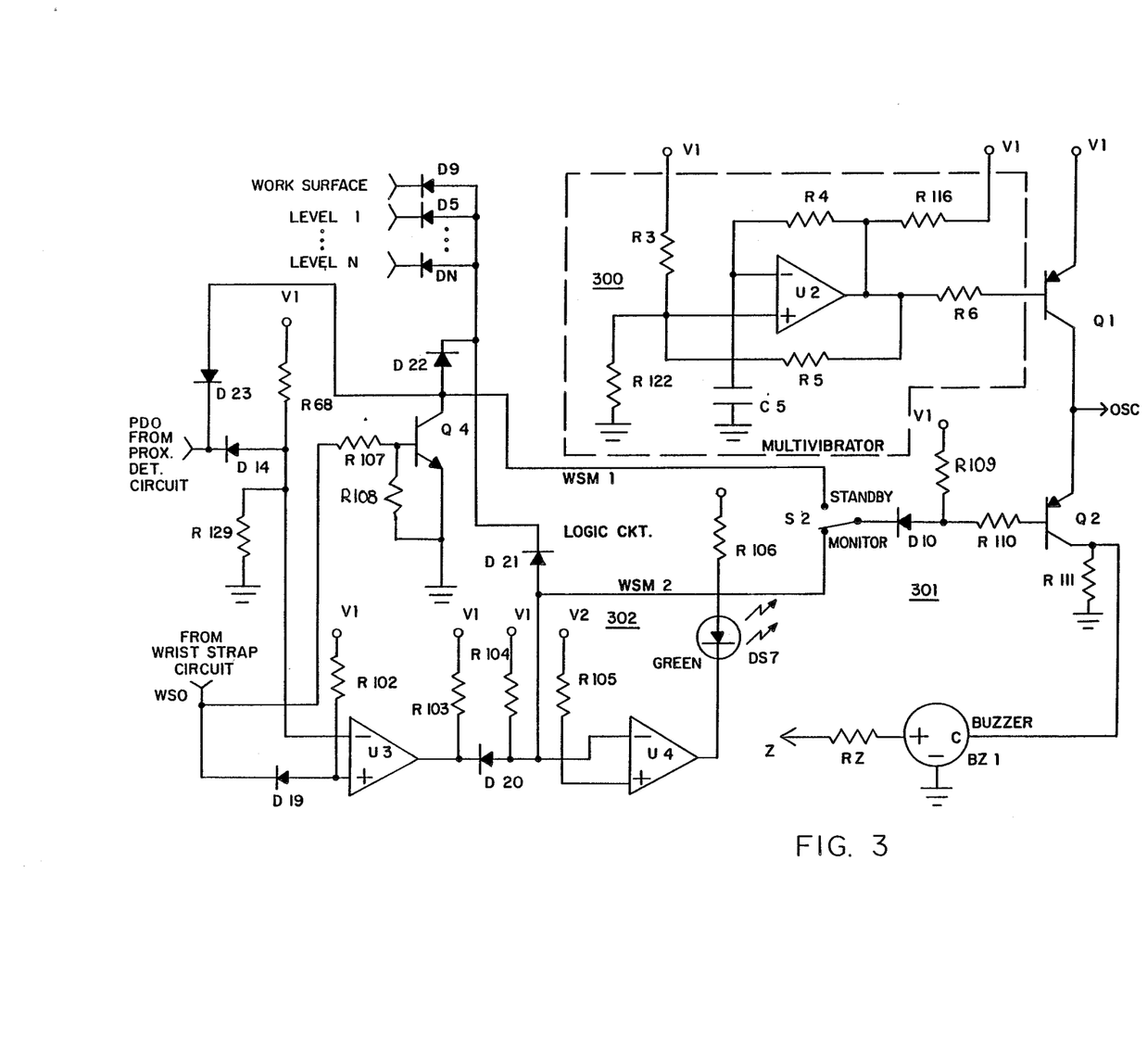
FIG. 3 is a schematic diagram of the logic multivibrator and sound producing circuit portion of the system of the instant invention.

Referring now to FIG. 3, there is shown a schematic diagram of the multivibrator, logic and alarm circuit 104 of FIG. 1. Any typical multivibrator or oscillator circuit can be used to provide the multivibrator signal, OSC. An oscillator circuit 300 of conventional design is shown. This oscillator includes comparator U2 with feedback resistors R4 and R5 connected from the output to the minus and plus inputs, respectively. The minus and plus inputs are also connected to ground via capacitor C5 and resistor R122, respectively. Bias resistor R3 connects the plus terminal to source V1. The output terminal of the oscillator is also connected to source V1 via resistor R116. As noted, this is a conventional oscillator circuit which, in this instance, provides the square wave pulse OSC noted above.

The alarm circuit 300 receives the signal OSC at the base electrode of PNP transistor Q1 via resistor R6. The emitter electrode of transistor Q1 is connected to the source V1 whereby transistor Q1 is rendered non-conductive when the output (OSC) of the oscillator is high. Conversely, when the signal OSC is low, transistor Q1 conducts and continuously applies power to the anode of LED DS1 and the like. However, unless and until a low level signal is supplied to the cathode of the LED or to the audible alarm driver (described hereinafter), the multivibrator signal OSC is ineffective to render the LEDs or the audible alarm inoperative.

A control switch S2 is connected to receive signals WSM #1 and WSM #2, which are generated elsewhere in the circuit as will be described, infra. Switch S2 is connected to the base electrode of transistor Q2 via coupling diode D10 and the voltage divider network comprising resistors R109 and R110. The emitter of PNP transistor Q2 is connected to receive the signal OSC. The collector electrode is connected to ground via the load resistor R111 and to the control terminal C of buzzer BZ-1. Power to the buzzer is supplied by the power supply represented by terminal 2.

As described hereinafter, the switch S2 is selectively set to either the STANDBY or MONITOR position by the operator. In the event that a high level WSM #1 or WSM #2 signal is supplied at the active position of switch S2, diode D10 is reverse biased. A high level signal is then applied to the base electrode of transistor Q2 from source V1 via resistors R109 and R110. Transistor Q2 is, thereby, rendered non-conductive despite the presence of the multivibrator signal OSC at the emitter of the transistor. A low voltage is then applied to the control terminal of the buzzer and the auditory alarm is rendered inactive.

Conversely, if a low level signal WSM #1 or WSM #2 is supplied to the active position of switch S2, diode D10 is forward biased, and transistor Q2 is activated. The multivibrator signal OSC applied to the emitter of transistor Q2 causes transistor Q2 to be selectively conductive and, therefore, causes the collector of Q2 to become alternatively high and low in synchronization with the multivibrator signal. The auditory alarm (buzzer) is turned on and off in synchronization with the multivibrator signal. It is sufficient to say, at this point, that the control signals WSM #1 and WSM #2 are indicative of the condition of the wrist strap circuit, the proximity detector circuit, work surface monitor circuit and the level monitor circuits.

The logic section 302 of FIG. 3, comprising comparators U3 and U4, an OR-gate comprising diodes D9, D5 through DN, as well as transistor Q4, provides the control to LED DS7, as well as the audible alarm control signals WSM #1 and WSM #2. Under any circumstances, a fault (or low level) signal from any of the resistance monitoring circuits will cause the appropriate red LED DS1 to flash, extinguish the green "safe" LED DS7 and cause the audible alarm to sound.

Figure 4:
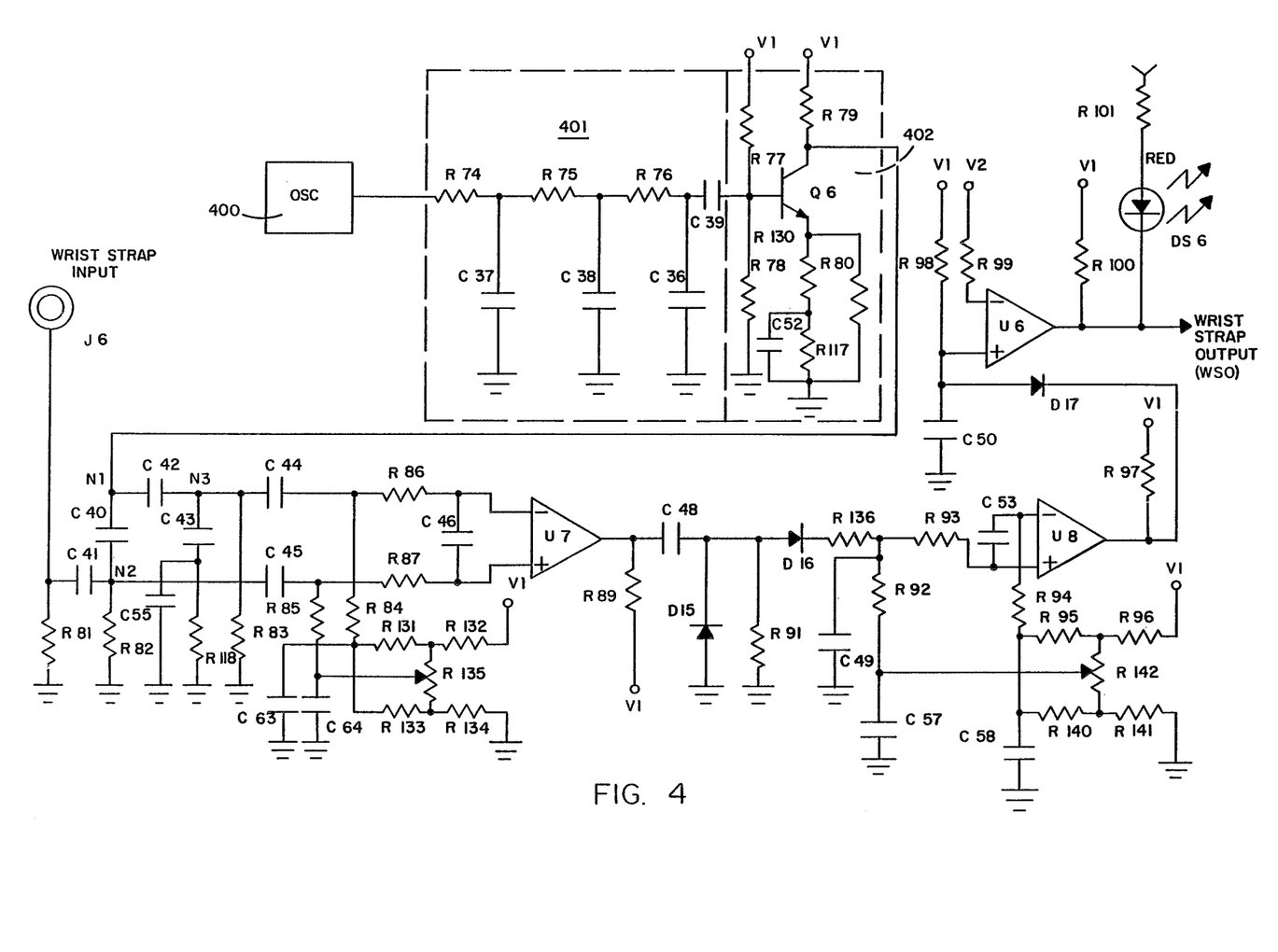
FIG. 4 is a schematic diagram of the wrist strap monitor portion of the system of the instant invention.

In particular, the control circuit comprises comparator U3, which has the plus input terminal thereof connected to the terminal WSO of comparator U6 of the wrist strap sensor circuit (see FIG. 4). This connection is made by means of coupling diode D19 as described later.

Figure 5:
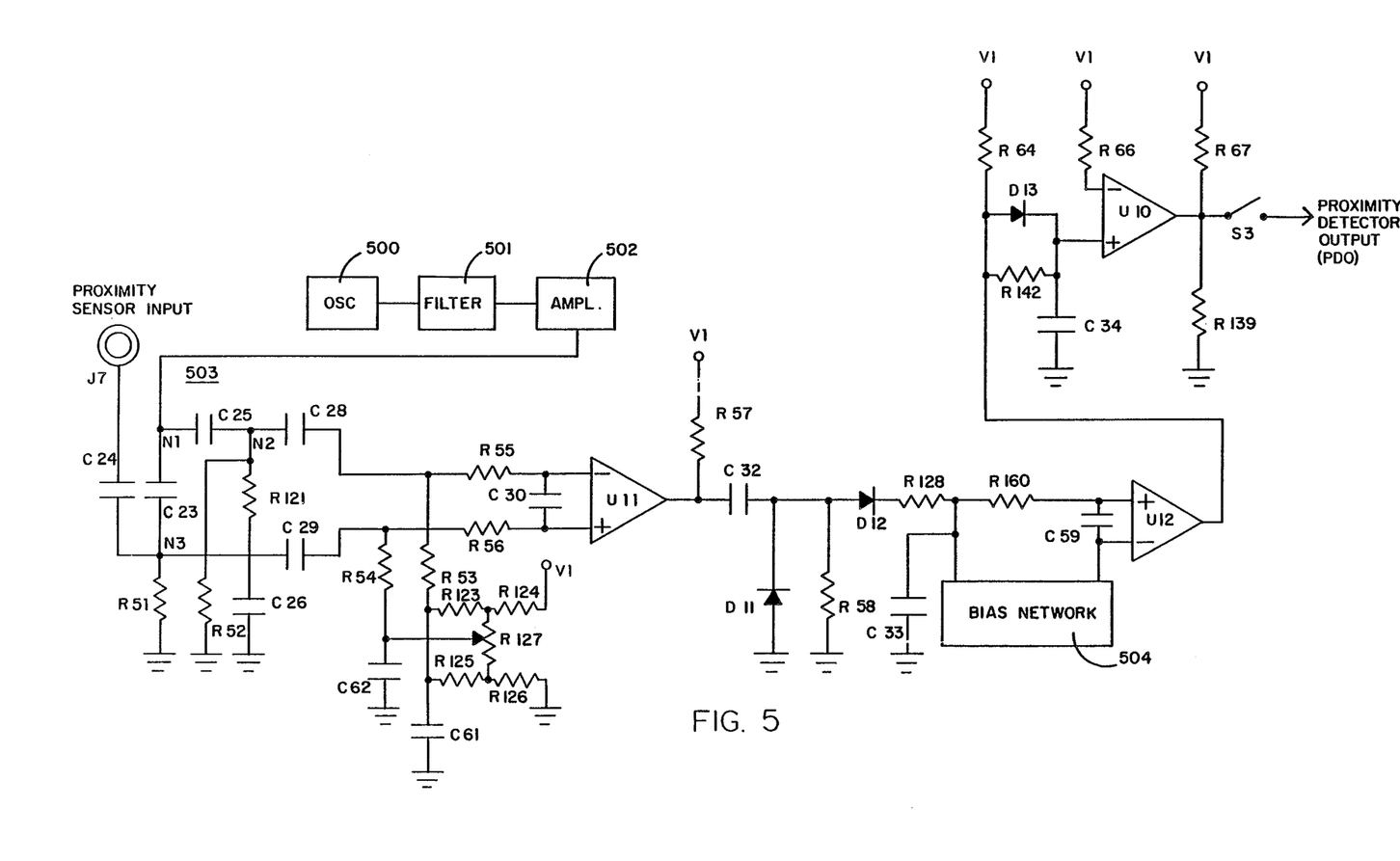
FIG. 5 is a schematic diagram of the proximity detector portion of the system of the instant invention.

The minus terminal of comparator U3 is connected to the terminal PDO at the output of the proximity sensor circuit shown in FIG. 5. This connection is made by coupling diode D14. In addition, the minus terminal is connected to source V1 by means of bias resistor R68 as well as to ground via resistor R129.

The output of comparator U3 is connected to the minus terminal of comparator U4 via coupling diode D20. The positive input terminal of comparator U4 is connected to source V2 by means of bias resistor R105. The output of comparator U4 is connected to the cathode of light emitting diode DS7, which has the anode thereof connected to source V1 via current limiting resistor R106. In this embodiment, diode DS7 produces a green light which is used to indicate a "safe condition". In addition, the output terminal WSO of the wrist strap sensor circuit is connected to the base electrode of transistor Q4 via resistor R107. The bias resistor R108 is connected between the base of transistor Q4 and ground. The collector of NPN transistor Q4 is connected to supply the WSM #1 signal to the alarm circuit STANDBY position of switch S2. In addition, diode D22 is connected to the emitter of transistor Q4 as part of the OR-gate.

It should be recognized that there are two modes of operation for the system. That is, the system can be operated with or without proximity detection. Proximity "ON/OFF" switch S3, which will be described relative to FIG. 5, determines the mode of operation.

In the first mode, the proximity "ON/OFF" switch is open, diodes D23 and D14 are non-conductive. In this mode, only the wrist strap operation and the levels are monitored. Furthermore, the audible alarm function for the wrist strap is determined by the position of the switch S2.

In one case, a low level signal is received from the wrist strap circuit and is indicative of a fault condition. That is, with the switch S2 in the "MONITOR" position, the signal WSM #2 controls and a "fault" detected by the wrist strap circuit (FIG. 4) will cause an audible alarm and a "safe" condition will silence the audible alarm.

That is, a low level signal is supplied to the plus terminal of comparator U3 and produces a low level output at comparator U3. The output of comparator U3 is coupled to the minus (−) input of comparator U4 via diode D20. The plus (+) input of comparator U4 is connected to source V2 via resistor R105 and biased at approximately one-half the voltage of V1. Therefore, LED DS7, connected to V1 via R106, is extinguished when the output of comparator U4 becomes high.

Concurrently, the low level at the output of comparator U3 produces a low signal at WSM #2. While switch S2 is in the "MONITOR" position transistor Q2 is activated and will cause the audible alarm to sound.

Additionally, as noted before, any other fault condition, i.e., work surface or one of the resistance monitors, will cause the minus (−) input of comparator U4 and signal WSM #2 to go low because of the connection to each of the monitors via the OR-gate. As a result, comparator U4 goes high, turning off LED DS7 and activating buzzer BZ1.

Conversely, a high signal from the wrist strap circuit, indicating that the wrist strap is not defective and is being properly worn by the operator, applied to the plus (+) input of comparator U3 causes the output of comparator U3 to be pulled high via resistor R103 which is connected to source V1. This high signal back-biases diode D20. Assuming that all of the resistance monitors are high, the minus (−) input of comparator U4 is pulled high via resistor R104 which is connected to source V1. Therefore, the output of comparator U4 becomes low. The low signal at the cathode of diode DS7 renders the LED conductive which becomes illuminated with a steady glow. In this embodiment, the activation of diode DS7 is used to indicate a "safe" condition.

Concurrently, the WSM #2 signal is high, whereupon transistor Q2 and the buzzer BZ1 are inactivated.

With the switch S2 in the "STANDBY" position, the opposite is true. That is, the signal WSM #2 controls and a "fault" condition detected by the wrist strap circuit will cause the audible alarm to be silenced whereas, a "safe" condition will cause the audible alarm to sound.

With switch S2 in the "STANDBY" position, source V1 is connected to the collector of transistor Q4 via diode D10, resistor R109 and switch S2. The comparators U3 and U4 operate as previously described. However, the signal used to activate the audible alarm now becomes WSM #1 which is generated at the collector of transistor Q4. With a fault condition detected by the wrist strap circuit, the input signal WSO from the wrist strap circuit is low. This causes transistor Q4 to nonconductive. In the absence of a fault condition from one of the resistance monitors (i.e., one of the diodes in the OR-gate is forward biased), signal WSM #1 remains high to turn off transistor Q2 wherein the audible alarm remains inactive.

A fault condition from any of the resistance monitors generates a low level from the particular monitor. This low level is coupled through the diode or diodes of the OR-gate and through diode D22 to cause signal WSM #1 to become low, thus, activating the alarm.

When, through the action of properly affixing the wrist strap, the output of the wrist strap circuit becomes high and is coupled to the base element of transistor Q4, rendering transistor Q4 conductive. This makes signal WSM #1 low, thus, activating the alarm.

In the second mode of operation, i.e., when used with the proximity detector, switch S3 (see FIG. 5) is closed. The level of the output signal PDO from the proximity detector switches from nearly ground (no operator or other person is being sensed) to two-thirds of V1 (proximity detector senses an operator or other person). Assuming that the switch S2 is in the "STANDBY" position, the output (WSM #1) of the proximity detector is coupled to the alarm circuit via diode D23. Because the proximity detector output level is not allowed to reach V1, diodes D23 and D10 become conductive and cause the alarm circuit BZ1 to be activated through transistor Q2 irrespective of the status of the wrist strap circuit.

When the switch S2 is in the "MONITOR" position, the alarm circuit is not activated by the proximity detector. Thus, at all times the system is to be used with proximity detection, the switch S2 is placed in the MONITOR position.

When the proximity detector senses that an operator or other person has approached the workstation, the output of the proximity detector is at two-thirds of V1 and is applied to the cathode of diode D14. The voltage divider action of resistors R68 and R129 produces about one-half of V1 and causes the diode D14 to be reverse biased. Since the switch S2 is in the "MONITOR" position, resistor R109 is disconnected from the collector of transistor Q4 and the anode of diode D23, rendering these components inactive.

With diode D14 back-biased (i.e., an operator or other person is at the workstation) the logic operates as described before. However, when the output of the proximity detector is low (i.e., no operator or other person is being sensed), the minus input (−) of comparator U3 is driven low, i.e., to approximately the voltage drop across diode D14 or approximately 0.7 V. Since the output of the wrist strap circuit is coupled to the plus (+) input of comparator U3 via diode D19, the wrist strap circuit is unable to cause the plus (+) input of comparator U3 to drop below 1.4 V. Therefore, the output of comparator U3 to remains high and, does not, to sound the alarm or extinguish the green "safe" LED DS7.

Referring now to FIG. 4, there is shown a schematic diagram of the wrist strap circuit 102 in FIG. 1. This circuit includes an oscillator 400. While any typical oscillator circuit can be used, oscillator circuit 400 is similar to the oscillator 300 described above relative to FIG. 3. This is a conventional oscillator circuit which is designed, in this instance, to operate at approximately 1.6 KHz.

The output of the oscillator is passed through a filter network 401 comprising resistors R74, R75 and R76 and capacitors C36, C37 and C38. The filter provides low-pass filtering to the output of the oscillator to provide a sinusoidal waveform with a time rate which has little distortion.

The sinewave produced by the oscillator and filter is then amplified by the amplifier 402 comprising transistor Q6 together with resistors R77, R78, R79, R80, R117 and R130, as well as capacitor C52 all of which are connected to ground or to the source V1, as shown.

The components shown connected between the output (collector electrode) of the amplifier transistor Q6 and the wrist strap jack J6, and the inputs of comparator U7 comprise a capacitance bridge 403, a low pass filter 404, a high pass filter 405 and a biasing network 406.

When properly connected to a person, jack J-6 contains both resistive and capacitive components. The wrist strap, typically, contains a series resistor for the protection of the operator. The impedance between jack J6 and ground is determined by the square-root of the sum of the squares of the capacitance and resistance.

In order for the change in capacitance to be dominant, the bridge must be configured with capacitance values and a stimulus frequency such that the capacitive reactance is much higher than the resistance.

It is important to note that the wrist strap cord and the person to which the wrist strap is affixed constitute an antenna of sorts. Therefore, a multitude of signals will appear at jack J-6 which must be filtered out before comparator U7.

For any bridge to approach balance, each of the bridge arms must be identical (at least in terms of impedance) to its counterpart. In this embodiment, capacitors C40, C42, C55 and the capacitance presented by jack J-6 comprise the bridge with capacitor C40 representing the upper left element of the bridge, capacitor C42 the upper right element of the bridge, the capacitance presented by jack J6 the lower left element of the bridge and capacitor C55 the lower right element of the bridge.

Capacitor C41, of much larger value than the bridge elements, couples jack J6 to the bridge with capacitor C43 being the balancing counterpart. Resistor R81 provides the grounding path to the wrist strap with the balancing counterpart being resistor R118.

The bridge is configured to be closest to a null when the wrist strap is not being used. With the bridge at or near balance, the signal at the node N3 of capacitors C42, C43 and C44 is similar to the signal at the node N2 of capacitors C40, C41 and C45. Capacitor C44 couples the signal at node N1 via resistor R86 to the minus (−) input of comparator U7 while capacitor C45 couples the signal at node N2 via resistor R87 to the plus (+) input of comparator U7.

The signal at jack J6 consists of the oscillator frequency and those atmospheric signals that have been picked up, predominantly 60 Hz. Capacitor C41 and resistor R82 form the first stage of a high pass filter. counterpart capacitor C43 and resistor R118 have been added to maintain balance, although they are not required for filtering. A second high pass filter stage is formed by capacitor C45 and resistor R85 along with the counterpart capacitor C44 and resistor R84. A low pass filter is formed by resistors R86 and R87 and capacitor C46.

A biasing network to the inputs of comparator U7 is comprised by resistors R131, R132, R133, R134 and variable resistor R135 connected between V1 and ground, while resistors R84, R85, R86 and R87 connecting the bias voltages to the plus (+) and minus (−) inputs of comparator U7. Capacitors C63 and C64 provide the AC coupling to ground for the low pass filter.

The biasing network is configured to provide appropriate ratios rather than fixed values. Therefore, changes in temperature and supply voltages, which affect all of the bias components equally, will not change the ratio and, therefore, will not adversely affect the operating points. Additionally, offset variations between comparators can be accommodated by the adjustable resistor R135.

Resistors R132 and R134 are equal in value as are resistors R131 and R133. Thus, the voltage at the node of resistors R84, R131 and R133 will be approximately one-half V1. Potentiometer R135 provides a degree of adjustment, both positive and negative, with respect to the node to compensate the circuit for variations in input offset currents of the comparator U7 and to provide a means for setting the "threshold" or sensitivity of the circuit.

Load resistor R89 is connected between source V1 and the output of comparator U7. With the bridge close to null, no pulses are present at the output of comparator U7. As capacitance is added to the input at jack J6 by a person affixing the wrist strap, the bridge becomes more unbalanced. The signal at the plus (+) input becomes smaller than the signal at the minus (−) input. When the "threshold" set by resistor R135 is exceeded, pulses are generated at the output of comparator U7.

The resulting pulses at the output of comparator U7 are AC coupled via capacitor C48 to the integrator circuit comprising resistors R92 and R136 with capacitor C49. Diode D15 clamps the signal at ground. The time constant of resistor R91 and capacitor C48 is such that the duration of the pulses at the output of comparator U7 are limited thereby preventing noise pulses with long time constants from charging the next circuit excessively. Diode D16 couples the pulses to the integrator formed by resistors R136 and R92 and capacitor C49. The time constant defined by resistor R136 and capacitor C49 sets the charging rate of the integrator while the time constant defined by resistor R92 and capacitor C49 sets the discharge rate.

A biasing network comprised of resistors R96, R95, R140, and R141 and variable resistor R142 provide the biases, offset compensation and "threshold" adjustment for comparator U8, in the same fashion as previously described for comparator U7. Resistors R92, R93 and R94 couple the bias voltages to the plus (+) and minus (−) inputs of comparator U8.

Typically, the bridge is balanced when the wrist strap is worn by an operator. When the bridge is unbalanced and a square wave signal train is produced at the output of comparator U7. This signal is coupled via capacitor C48, diode resistor R136 to charge up capacitor C49, which ultimately applies a high level signal to the plus terminal of the comparator U8 in the control circuit 405. As a result, comparator U8 produces a high level output signal whereby the output terminal of comparator U9 is high. This signal condition causes the light emitting diode DS6 to be rendered nonconductive. However, when the wrist strap is not worn by the operator, the bridge is near to being balanced. The pulses narrow in width (or disappear completely), capacitor C49 discharges and the output of comparator U8 becomes low. The output of comparator U6 also goes low causing diode DS6 to be conductive. Inasmuch as the oscillating signal OSC is connected to the anode thereof, diode DS6 flashes to warn of the "fault" condition.

When a succession of pulses are generated at the output of comparator U7, integrating capacitor C49 begins to charge. The time constant of resistor R136 and capacitor C49 is much smaller than the time constant of resistor R92 and capacitor C49. Therefore, capacitor C49 is still somewhat charged when it receives an additional charge from the succeeding pulse. The voltage across capacitor C49 continues to rise with each succeeding pulse until the "threshold" voltage of the comparator inputs is reached and the output of capacitor U8 becomes high. Conversely, when the operator removes the wrist strap or a fault occurs in the wrist strap the pulses cease. Integrating capacitor C49 becomes discharged, whereupon the voltage at the plus (+) input of comparator U8 drops and the output of comparator U8 becomes low once again.

Load resistor R97 is connected between the output of comparator U8 and source V1. The output of comparator U8 is also connected to the plus (+) input of comparator U6 via diode D17. When the output of comparator U8 goes low (no additional capacitance seen at jack J6), capacitor C50 is instantaneously discharged via diode D17 and the plus (+) input of comparator U6 drops to a low level. The minus (−) input of comparator U6 is biased at mid-point via resistor R99 which is connected to source V2. With the plus (+) input of comparator U6 more negative than the minus (−) input, the output of comparator U6 becomes low. As a result, the wrist strap indicator LED DS6 flashes and the low signal WSO is coupled to the logic circuit as previously described relative to FIG. 3.

On the other hand, when the output of comparator U8 goes high (additional capacitance is seen at jack J6), diode D17 is back-biased and capacitor C50 begins to charge. After the charge delay, capacitor C50 becomes sufficiently charged to exceed the voltage at the minus (−) input of comparator U6. As a result, the output of comparator U6 becomes high, back-biasing LED DS6. Thus, the indicator is extinguished and a logic high level is presented to the logic circuit.

The delay in charging capacitor C50, which in this embodiment is selected to be about one second, is necessary to detect momentary or intermittent interruptions in the continuity of the wrist strap assembly. By making the discharge of capacitor C50 instantaneous and the charge time of capacitor C50 about one second, any momentary break will cause the audible alarm to sound for one second, thus attracting the attention of the operator, so that appropriate action may be taken.

Referring now to FIG. 5, there is shown a schematic diagram of the proximity detector circuit 101 of FIG. 1. This circuit includes an oscillator 500 of conventional design. This oscillator can include a comparator and feedback resistors and the like, similar to the oscillator circuit 300 shown and described relative to FIG. 3. The oscillator circuit is designed, in this instance, to operate at approximately 16 KHz.

The output of the oscillator is passed through a filter network 501 comprising resistors and capacitors similar to the filter network 401 shown and described relative to FIG. 4. The filter 502 provides low pass filtering to the output of the oscillator so as to provide a sine wave with a time rate which has little distortion.

The sine wave produced by the oscillator and filter is then amplified by the amplifier 502 comprising a transistor together with other components similar to the amplifier 402 shown and described relative to FIG. 4. The signal from the amplifier 502 is supplied to node 1 of capacitor bridge 503.

In the bridge circuit, capacitor C25 is connected between nodes 1 and 2, while capacitor C23 is connected between nodes 1 and 3. The series combination of capacitor C26 and resistor R121 is connected between node 2 and ground which, in this instance, operates as node 4 of the bridge. It is noted that jack J7 is also connected between node 3 and ground. Thus, in this embodiment, capacitors C23, C25, C26 and the capacitance represented by jack J7 comprise the bridge circuit. In particular, capacitor C23 represents the upper left element of the bridge, capacitor C25 represents the upper right element of the brige, the capacitance included in jack J7 represents the lower left element of the bridge and capacitor C26 represents the lower right element of the bridge. Capacitor C24, of much larger value than the bridge elements, couples jack J7 to the bridge. It is seen that the bridge in FIG. 5 does not contain a grounding resistor (equivalent to resistor R81 in FIG. 4). Therefore, there is no need for a balancing counterpart to capacitor C24.

Typically, the proximity detector sensor consists of a metallic plate or strip, usually mounted beneath and to the front of the work surface. This plate is connected to the circuit by a coaxial cable via jack J1 which may include a large amount of AC series resistance. Consequently, a matching capacitor C26 and series resistor R121 are included in the bridge to prevent the phase shift that would otherwise make it possible to approach a balanced condition.

The nodes 2 and 3 are referenced to ground via bias resistors R52 and R51, respectively. The nodes 2 and 3 are also connected to the minus and plus input terminals, respectively, of comparator U11. This connection is made via the filter capacitors C28 and C29, respectively. resistor network comprising the signal at jack J7 consists of the oscillator frequency and any atmospheric signals which have been picked up, predominantly 60 Hz. Capacitor C24 and resistor R51 form the first stage of a low-pass filter. Counterpart resistor R52 has been added to maintain balance, although not required for filtering.

Capacitors C28 and C29, together with resistors R55 and R56, respectively, provide low pass filtering, and the counterpart network therefore. Resistors R55 and R56 with capacitor C30 provide the high pass filtering stage for the bridge 503. Typically, the bias resistor networks are arranged to provide a mid-point bias for the comparator U11.

In the normal operation, the bridge 503 is closest to balanced, in the absence of a human in the sensed environment. With the bridge at or near balance, the signal at node N2 of capacitors C25 and C26 is similar to the signal at node N3 of cpacitors C23 and C29. Capacitor C28 couples the signal at node N2 via resistor R55 to the minus (−) input of comparator U11 while capacitor C29 couples the signal at node N3 via resistor R56 to the plus (+) input of comparator U11.

In the event that an ungrounded person arrives in the proximity of the sensor, the capacitive reactance is altered, whereupon bridge 503 is more out of balance. As the difference between the nodes N2 and N3 increases, the pulses at the output of comparator U11 become wider. The width of these pulses determines the amplitude to which integrating capacitor C33 will charge. Thus, a noise pulse with a long duration could cause the integrating capacitor C33 to become charged and false-trigger the detector. To prevent this, the output pulses from comparator U11 are width limited by capacitor C32 and resistor R58. Also, diode D11 clamps the signal to ground to maintain a constant pulse amplitude. This circuit operates to provide a charge to integrating capacitors C33 in the same fashion as capacitor C49 in FIG. 4.

The output signal produced by comparator U11 is, after shaping, a rectangular wave. It is connected via coupling capacitor C32 and rectifier diode D12, as well as biasing resistors R59 and R60, to the plus input of amplifier U12. Diode D11 is used to clamp the low side of the signal to ground. The resistor R58 provides a return to ground for coupling capacitor C32. This circuit operates to provide charge to capacitor C33, which is charged to the peak value of the output signal of comparator U11 in the same fashion as capacitor C49 in FIG. 4.

When capacitor C33 is charged up because of the proximity of an ungrounded person to the workstation, the signal at the plus terminal of capacitor U12 is high with respect to the reference potential supplied at the minus terminal thereof by the bias network 504 which is similar to the bias network 403 of FIG. 4. With this signal condition, the comparator U12 produces a high level output signal. This high level output signal causes a high level signal to be supplied to the plus input of comparator U10 via diode D13. As a result, the output of comparator U10 also goes low. If switch S3 is open, indicating that the proximity detector is deactivated, no effect is produced by the proximity detector. On the other hand, if switch S3 is closed, the high level signal is supplied to the logic circuit shown in FIG. 3 to produce a control function as described supra.

Of course, in the absence of an ungrounded person, the proximity sensor remains nearly balanced. The lack of signals produced by comparator U11 does not charge capacitor C33 sufficiently to affect comparator U12. The low level output signal produced by comparator U12 reverse biases diode D13 and provides a return path to ground via resistor 142 whereupon capacitor C34 is discharged toward ground. As a result, comparator U10 produces a low level signal which is coupled to the logic circuit shown in FIG. 3 via switch S3, if the switch is closed.

In the circuit of FIG. 5, the coupling between the output of comparator U12 and the plus (+) input of comparator U10 is arranged differently from the circuit in FIG. 4. That is capacitor C34 charges instantly and discharges slowly. When the output of comparator U12 goes high, diode D13 becomes forward-biased until capacitor C34 is charged. When the output of comparator U12 goes low, diode D13 becomes back-biased and capacitor C34 must discharge through resistor R142.

Also, resistor R139 is placed at the output of comparator U10 so that the voltage to switch S3 will switch between ground and two-thirds V1 as explained in regard to the logic section of FIG. 4. As noted, switch S3 allows the flexibility of operating the system in the two modes, viz with or without the proximity detection.

Thus, there is shown and described a preferred embodiment of the instant invention. This description recites a specific arrangement of components to obtain preferred results. Other arrangements of the components may be conceived by those skilled in the art. Any changes or modifications which are included in any such arrangements and which fall within the purview of this description are intended to be included therein as well. This description is intended to be illustrative only and is not intended to be limitative of the invention. Rather, the scope of the invention is limited only by the scope of the claims appended hereto.

I claim:

1. A fault monitoring system comprising,
   a wrist strap monitoring circuit connected to monitor the grounded status of an operator at a workstation;
   a proximity monitoring circuit connected to monitor the presence status of a person in proximity to said workstation;
   at least one surface monitoring circuit connected to monitor the grounded status of a surface related to said workstation;
   logic circuit means connected to each of said wrist strap monitoring circuit, said proximity monitoring circuit and said at least one surface monitoring circuit to receive signals therefrom which signals are representative of the status monitored by the respective monitoring circuit; and
   alarm means connected to be selectively activated by said logic circuit means when one or more of said monitoring circuits produces a signal indicative of a prescribed status condition thereat.

2. The system recited in claim 1 wherein,
   said wrist strap monitoring circuit and said proximity monitoring circuit each include a capacitance bridge network.

3. The system recited in claim 1 wherein,
   said at least one surface monitoring circuit comprises resistance measuring circuitry.

4. The system recited in claim 1 wherein,
   said alarm means includes sound producing means for producing an audible alarm signal.

5. The system recited in claim 1 wherein,
   said alarm means includes light emitting means for producing a visual alarm signal.

6. The system recited in claim 1 including,
   multivibrator means for selectively supplying signals to said alarm means to produce an indication thereby when activated by said logic circuit.

7. The system recited in claim 1 including,
   switch means for selectively bypassing said proximity monitoring circuit.

8. The system recited in claim 2 wherein,
   each of said proximity monitoring circuit and said wrist strap monitoring circuit includes oscillator means connected to supply signals to the respective capacitance bridge network.

9. The system recited in claim 8 wherein,
   each of said proximity monitoring circuit and said wrist strap monitoring circuit includes filtering means connected between said oscillator means and the respective capacitance bridge network.

10. The system recited in claim 3 wherein,
    said resistance measuring circuitry includes,
    comparator means,
    reference potential means connected to supply a reference signal to said comparator means,
    voltage divider means connected to supply a monitored signal to said comparator means for comparison with said reference signal, and
    indicator means connected to the output of said comparator means to be selectively activated as a function of the comparison between said reference signal and said monitored signal by said comparator means.

11. The system recited in claim 10 including,
    input means connected to said voltage divider means,
    said input means connected to said one surface to monitor the potential at said one surface and to selectively control the monitored signal supplied to said comparator means via said voltage divider means.

12. The system recited in claim 11 including,
    switch means connected to said voltage divider means to selectively clamp the monitored signal to a prescribed level in order to determine the operation of said comparator means.

13. The system recited in claim 11 including,
    filter capacitors connected to said comparator means to prevent interference signals from affecting operation of said comparator means.

14. The system recited in claim 10 including,
    oscillator means connected to said indicator means to supply an oscillator signal thereto in order to activate said indicator in response to the operation of said comparator means.

15. The system recited in claim 10 including,
feedback means connected around said comparator means to provide a hysteresis operation of the said comparator means thereby to render the operation of said indicator means unambiguous.

16. The system recited in claim 2 wherein,
each of said capacitance bridge networks includes,
capacitance bridge circuit means,
oscillator circuit means connected to a first node of said capacitance bridge circuit means,
input means connected to a second node of said capacitance bridge circuit means and forming a branch of said capacitance bridge circuit means,
comparator means connected across a pair of nodes of said capacitance bridge circuit means to receive signals from said oscillator circuit means via said capacitance bridge circuit means and which signals are a function of the effect of said input means upon said capacitance bridge circuit means,
integrator means connected to receive output signals from said comparator means, and
indicator means connected to said integrator means to be selectively activated in accordance with the signal produced at said integrator means.

17. The system recited in claim 16 including,
second comparator means connected between said integrator means and said indicator means.

18. The system recited in claim 16 including,
filter network means connected between said oscillator circuit means and said capacitance bridge circuit means.

19. The system recited in claim 18 including,
amplifier means connected between said filter network means and said capacitance bridge network means.

20. The system recited in claim 17 including,
bias network means connected to each of said comparator means and said second comparator means.

21. The system recited in claim 16 wherein,
said input means includes a wrist strap apparatus to be worn by an operator at a workstation.

22. The system recited in claim 18 wherein,
said oscillator circuit means produce a senusoidal waveform, and
said filter network means comprises a low-pass filter circuit.

23. The system recited in claim 16 including,
bandpass filter means connected between said capacitance bridge network means and said comparator means.

24. The system recited in claim 16 including,
filter means connected between said input means and said capacitance bridge network means to eliminate unwanted signals at said input means.

25. The system reicted in claim 16 wherein,
said input means comprises a proximity sensor which includes a metallic element.

26. The system recited in claim 16 including,
charge storage means connected between said indicator means and said integrator means for selectively charging or discharging in accordance with the condition of the output signal produced by said comparator means.

27. The system recited in claim 6 wherein,
said multivibrator means includes,
comparator means,
fixed reference voltage supply means connected to a first input of said comparator means,
variable input signal means connected to a second input of said comparator means, and
feedback means connected from the output of said comparator means to each of said first and second inputs of said comparator means.

28. The system recited in claim 1 wherein,
said logic circuit means includes OR-gate means connected to selectively pass signals therethrough to activate said alarm means if one or more of said monitoring circuits produces an alarm signal.

29. The system recited in claim 28 including,
control means for supplying an alarm signal to said alarm means in response to a signal from said OR-gate means.

* * * * *